United States Patent [19]

Cronin

[11] Patent Number: 5,265,531
[45] Date of Patent: Nov. 30, 1993

[54] RECIPROCALLY SHUTTLED DOUBLE SIDED SCREENER WITH TILTABLE PRINT SQUEEGEE

[76] Inventor: John Cronin, 17370 Mt. Herman Cir., Fountain Valley, Calif. 92708

[21] Appl. No.: 750,853

[22] Filed: Aug. 27, 1991

[51] Int. Cl.$^5$ .................. B41F 15/08; B41F 17/00
[52] U.S. Cl. ............................ 101/35; 101/123; 101/126
[58] Field of Search ............. 101/35, 41, 123, 126, 101/120, 122; 198/345.1, 345.3, 465.2; 271/245, 271

[56] References Cited

U.S. PATENT DOCUMENTS

| | | |
|---|---|---|
| 1,840,073 | 1/1932 | Williams . |
| 1,901,473 | 3/1933 | Respess . |
| 2,039,909 | 5/1936 | Kem et al. . |
| 2,237,734 | 4/1941 | Grimsted . |
| 2,355,930 | 8/1944 | Thorne . |
| 2,581,775 | 1/1952 | Wade . |
| 2,704,510 | 3/1955 | Walsh, Jr. . |
| 2,739,530 | 3/1956 | McLaurin . |
| 2,751,842 | 6/1956 | McLaurin . |
| 2,810,340 | 10/1957 | Saunders . |
| 2,917,997 | 12/1959 | Black . |
| 2,963,964 | 12/1960 | Klump . |
| 2,975,705 | 3/1961 | Gilman . |
| 3,040,657 | 6/1962 | Ichinose . |
| 3,046,879 | 7/1962 | Ichinose . |
| 3,066,602 | 12/1962 | Ichinose . |
| 3,102,472 | 9/1963 | Kieckhefer, Jr. . |
| 3,137,230 | 6/1964 | Ichinose . |
| 3,166,011 | 1/1965 | Landesman . |
| 3,398,680 | 8/1968 | Moskowitz . |
| 3,483,819 | 12/1969 | Hughes, Jr. . |
| 3,690,647 | 9/1972 | Matsuo .................. 271/271 |
| 3,730,082 | 5/1973 | Perry .................. 101/93.14 |
| 3,731,623 | 5/1973 | Bubley et al. . |
| 3,742,847 | 7/1973 | Gulikers . |
| 3,774,533 | 11/1973 | Ichinose . |
| 3,774,534 | 11/1973 | Ichinose . |
| 3,776,132 | 12/1973 | Rarey et al. . |
| 3,828,671 | 8/1974 | Fuchs . |
| 3,943,849 | 3/1976 | Vasilantone . |
| 3,955,501 | 5/1976 | Bubley et al. . |
| 4,005,651 | 2/1977 | Sigel et al. . |
| 4,014,428 | 3/1977 | Ossbahr .................. 198/345.3 |
| 4,063,503 | 12/1977 | Ichinose . |
| 4,063,531 | 12/1977 | Zitzow . |
| 4,079,674 | 3/1978 | Ichinose . |
| 4,084,505 | 4/1978 | Ichinose . |
| 4,084,506 | 4/1978 | Nakatani . |
| 4,094,242 | 6/1978 | Ichinose . |
| 4,226,182 | 10/1980 | Danielsen et al. . |
| 4,270,465 | 6/1981 | Lin . |
| 4,275,655 | 6/1981 | Artaud et al. . |
| 4,404,903 | 9/1983 | Cronin . |
| 4,419,613 | 12/1983 | Ichinose et al. . |
| 4,455,935 | 6/1984 | Manz et al. . |
| 4,682,271 | 7/1987 | Yamada . |
| 4,749,465 | 6/1988 | Flint et al. .................. 198/465.2 |
| 4,957,044 | 9/1990 | Cronin . |

FOREIGN PATENT DOCUMENTS

| | | |
|---|---|---|
| 1110179 | 9/1955 | Fed. Rep. of Germany . |
| 1107249 | 12/1955 | Fed. Rep. of Germany . |
| 702298 | 3/1966 | Italy . |
| 347162 | 6/1960 | Switzerland . |
| 1115115 | 9/1984 | U.S.S.R. . |
| 743850 | 1/1953 | United Kingdom . |
| 2057357 | 7/1979 | United Kingdom . |

*Primary Examiner*—Edgar S. Burr
*Assistant Examiner*—Ren Yan
*Attorney, Agent, or Firm*—Robbins, Berliner & Carson

[57] ABSTRACT

A vertical screening apparatus in which the board to be screened is reciprocally shuttled into and out of the print zone before and after vertical reciprocation of the flood blades and print squeegees. A mechanism is provided to horizontally locate each board and to jog each board between successive sequences of flood and print strokes. Means are provided for tilting the print squeegee between successive print strokes.

9 Claims, 14 Drawing Sheets

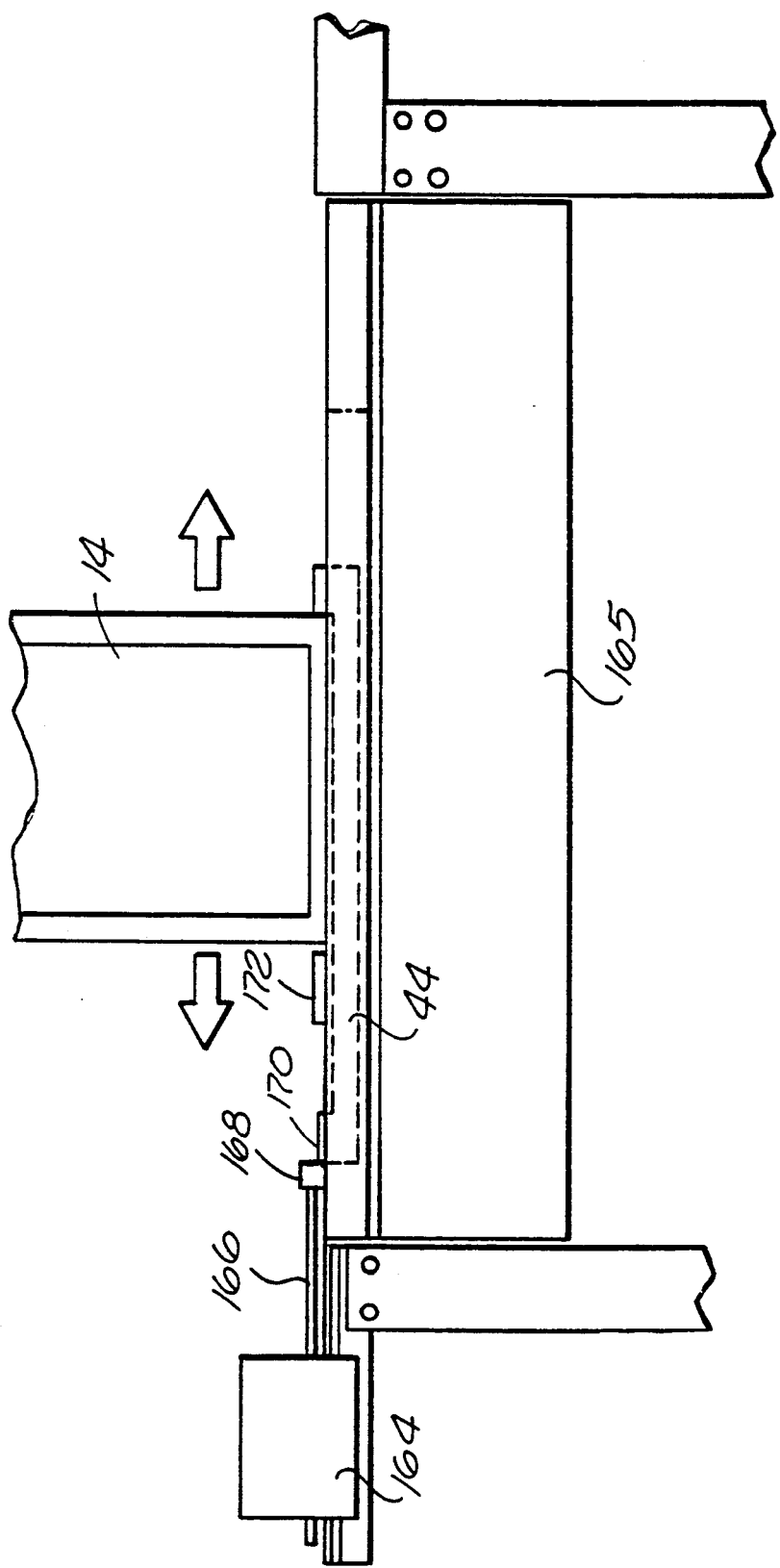

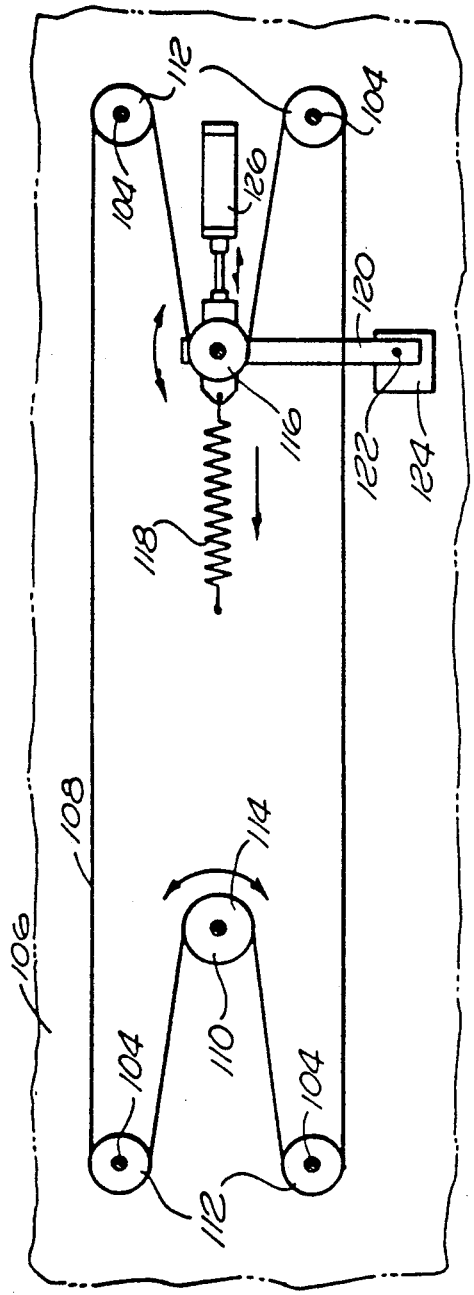
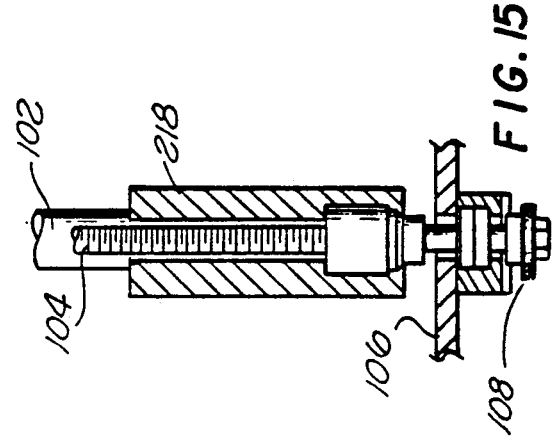
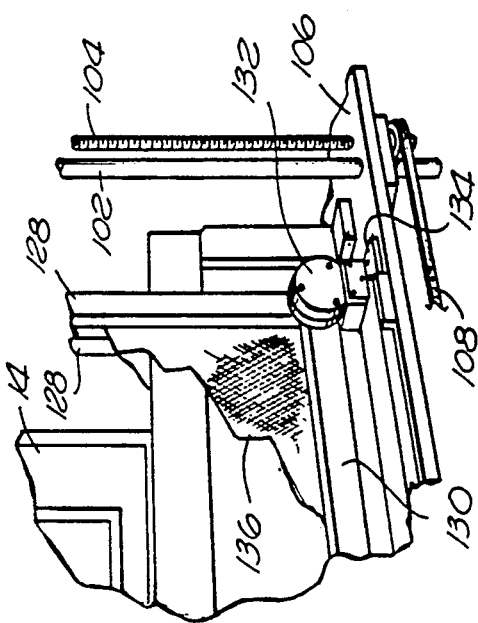

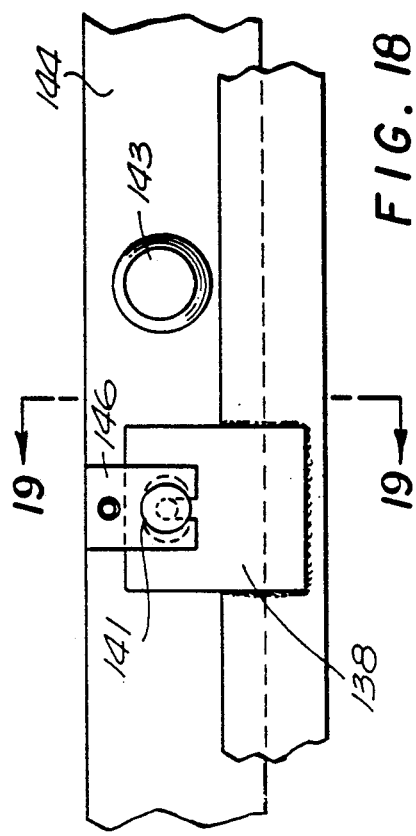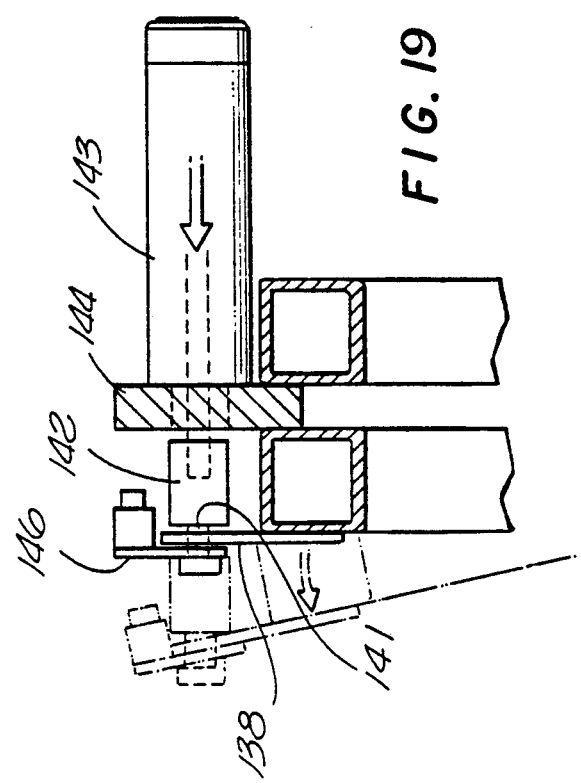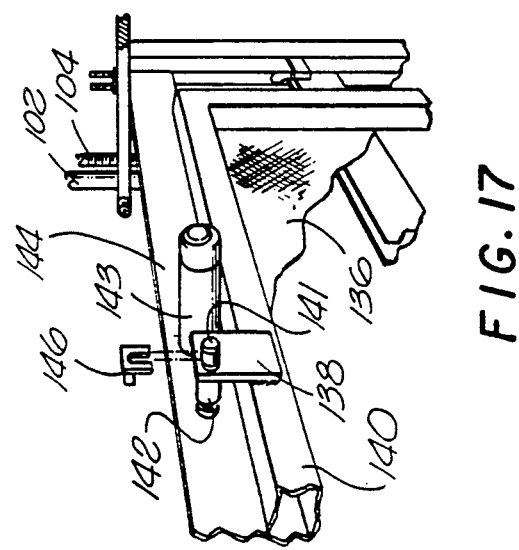

RECIPROCALLY SHUTTLED DOUBLE SIDED SCREENER WITH TILTABLE PRINT SQUEEGEE

FIELD OF THE INVENTION

This invention relates generally to the field of print screening devices. More particularly, the invention relates to the provision of a screen printing assembly capable of printing both sides of a circuit board simultaneously.

BACKGROUND OF THE INVENTION

Photopolymers have found widespread application in the preparation of printed circuit boards and other electronic devices. These materials are applied to circuit boards by screen printing and/or stenciling techniques which are well known in the art. Applicant's prior U.S. Pat. No. 4,404,903 describes a semi-automatic device that uses a horizontal print stroke to print a photoimagable soldermask ink on one side of a board. Applicant's prior U.S. Pat. No. 4,957,044 described an automatic device that uses vertical flood and print strokes to print photoimagable soldermask ink simultaneously on both sides of a board. Typically, a single flood stroke is used with a repeated print stroke. There are numerous advantages to simultaneously printing both sides of the board including: the avoidance of many individual handling steps; a single baking step that avoids the undercure of one side and overcure of the other when two separate printing steps are used; the prevention of oxidation of the copper which can occur when one side is uncoated during baking; the prevention of contamination when a board is handled with one side coated before the other; and elimination of the side-to-side variation inherent with single-sided coaters. In addition to overcoming these disadvantages, the vertical screening apparatus of U.S. Pat. No. 4,957,044 also provided a mechanism for avoiding the clogging of holes in the circuit boards with the soldermask ink. This was accomplished by jogging the chase holding the screens between each sequence of flood and print strokes.

The apparatus of U.S. Pat. No. 4,957,044 accomplished its purposes by means of a board transport mechanism which sequentially transported the boards into one side of a print zone of the assembly and, after the flood and print sequence, removed it from the other side of the print zone to carry it to a baking station. Each circuit board was secured at its top edge and carried, essentially hanging, through the print zone. A drawback to this arrangement, however, is that the apparatus is rather large, occupying a substantial amount of floor space to permit the travel from one side of the print zone to the other side and then through to the baking oven. In addition, while the mechanism of chase jogging between flood and print sequences went a long way toward eliminating the build-up of soldermask ink in the circuit board holes, it did little to eliminate another problem related to the common presence of corners defined by the meeting of vertical and horizontal circuit lines on the board. Strictly vertical print sweeps can, and often do, leave small voids at such corners.

SUMMARY OF THE INVENTION

The present invention provides a compact form of vertical screener in which the board, rather than being passed through the print zone, is reciprocally shuttled into and out of the print zone from one side of the apparatus. By such means, the apparatus can be shortened by almost 30% and also can be operated by one person. In order to accomplish this, however, an entirely new mechanism had to be devised to accurately and properly deliver the circuit board into and out of the print zone. The present invention provides such a mechanism. More particularly, a shuttling mechanism has been provided comprising a horizontal channel along the bottom of the chases in the print zone and a driven endless chain in the channel operative with a shuttlebar for receiving the bottom edge of the board to carry the board through the channel. A restraining clamp is applied to the top edge of the board which actuates a switch to activate the shuttling means. The circuit board is then carried into the print zone until a stop position is reached. In order to assure that the circuit board is properly horizontally located, the shuttling mechanism includes means for frictionally restraining movement of the board until a feed dog impinges upon the rear edge of the board, accurately locating the horizontal position of the board, which feed dog moves the board through the restraining means and into the print zone.

In order to avoid the build-up of ink in holes in the circuit board, rather than jogging the chases as in U.S. Pat. No. 4,957,044, the present invention provides a mechanism for shifting the travel stop of the board so that it accurately and adjustably alternates at horizontal locations from one flood and print sequence to another. Means are provided for accurately changing the distance between the two horizontal travel stop locations. The result is a shift of the relative location of the circuit board holes of the screen so as to avoid build-up in any circuit board holes.

In accordance with a further embodiment of this invention, the tendency to void corners of circuit lines, as above described, is prevented by providing means for tilting or skewing the print squeegees during the print stroke so that during each print stroke, the print squeegee is disposed at an angle from horizontal. As the flood stroke is accomplished during the vertical rise of the flood blade and print squeegee assembly, the head holding these components is horizontal. At the top of the stroke, during descent, both print squeegees are tilted or skewed at the same angle from horizontal in parallel alignment and then travel linearly downwardly with the squeegees disposed at such angle. Each flood/print sequence includes two print strokes. At the next print stroke, the tilt or skew is reversed, so that the angle of the squeegees alternate between acute and obtuse from one print stroke to another. In this way, circuit line corners that face in opposite directions will all have been properly swept. This, together with the jogging mechanism described above, effectively avoids all inconsistent ink patterns.

More specifically, a double sided vertical screening apparatus is provided that includes a feed rack assembly for driving vertically mounted printed circuit boards to a board transport mechanism from which boards are sequentially transported reciprocally into and out of the print zone of the vertical print assembly. After emerging out of the print zone, the board is replaced in the rack assembly. When the rack is full of coated boards, it is taken to an oven to be tack dried.

The board transport mechanism comprises a channel with an endless chain that can be rotated in either direction, which chain carries a shuttle bar fitted with a feed dog that interacts with the board and with a friction mechanism to accurately locate the horizontal position of the board.

The screen print assembly comprises two chases, ink wells, and a flood blade and squeegee vertical drive system. The chases are vertically mounted in opposing spatial relationship to facilitate the simultaneous application of photopolymer soldermask deposits on each side of the target circuit board. As is well known in the art, pliable penetrable screening membranes, commonly referred to as screens, are mounted within each chase. Each chase is pivotally mounted on its base to facilitate separation of the screening membranes from the target circuit boards following the print stroke.

The squeegee vertical drive system is formed from opposing flood blades and print squeegees conjunctively mounted on horizontal bars which reciprocate through vertical planes on opposite sides of the vertical chases. The horizontal bars are each slidably connected to guide bars which are mounted on the screener base and are driven by ball screw systems. A single chain drives all four screw systems.

Photopolymer soldermask material is applied to target circuit boards via a print stroke that is defined by a vertical rise of the squeegee vertical drive system, during which rise flood blades lift ink from a well at the bottom of the print zone to flood the screening membrane, followed by a first descent of the squeegee vertical drive system where print squeegees displace the inked membranes of each chase and cause them to contact each side of the circuit board for simultaneous printing, and then a second, non-flood rise followed by a second print stroke. The vertical rise and descent mechanism is similar to that in prior U.S. Pat. No. 4,957,044 including the use of a stop, preferably on one squeegee assembly only so that the opposing pressures serve to achieve and maintain parallel alignment of the squeegees.

The vertical drive system is raised and lowered by a screw mechanism that is driven by a unitary chain, in the present system from a single motor which engages the chain by means of a load spring held in place by a pivotally mounted loading bar. The chain can be unloaded by means of a pneumatic cylinder. This is a different mechanism than that provided by the apparatus of prior U.S. Pat. No. 4,957,044 which required a twin dc motors for counterbalanced drive.

As the print squeegees descend along each of the print screens, a pneumatic cylinder at the top of the chases causes the opposing chases to pivot about their bases, incrementally separating the print screens to allow the boards to be printed with a lower off contact resulting in a smooth ink deposit. As referred to above, the circuit board, rather than the chases, are jogged to avoid build-up of photopolymer soldermask on the screens at circuit board hole locations; a jog of approximately one-quarter of an inch between each flood and print sequence is used. Additionally, again as described above, the print squeegees are skewed between an acute and obtuse angle, during each print stroke to provide increased consistency and reliability and smoother coatings.

At the end of the second print stroke, with the chases in a fully opened position, the board transport assembly moves the printed board from the print zone back out to the rack. As each printed board is removed from the printing zone and replaced in the rack, the rack indexes forward and another board is placed in the channel. This system can thus run continuously with only minor manual operation.

BRIEF DESCRIPTION OF THE DRAWINGS

FIG. 9 is an elevational view of the shuttling mechanism;

FIG. 13 is a plan view from the bottom of the assembly base plate showing the drive chain and screws;

FIG. 14 is a partial perspective view of the invention showing the chase mounting assembly;

FIG. 15 is a partial cross-sectional view of the invention showing the ball screw drive mechanism;

FIG. 17 is a partial perspective view of the invention showing the chase pivot drive mechanism;

FIG. 18 is a partial elevation view of the invention showing the chase pivot drive flange and stabilization bar;

FIG. 19 is a cross-section of the invention taken along lines 19—19 of FIG. 18;

DETAILED DESCRIPTION OF THE INVENTION

Figure 1:
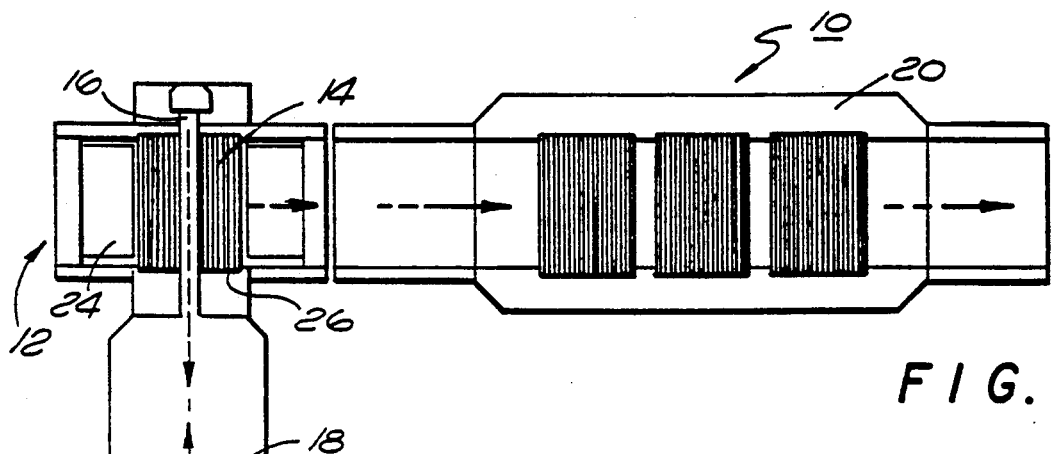
FIG. 1 is a schematic plan view of a double sided screening apparatus that has been constructed in accordance with the present invention.

Referring to FIG. 1, a schematic top view of an automated screening apparatus 10 is shown. The apparatus has a feed mechanism 12 that sequentially drives printed circuit boards 14 to contact a board transport mechanism 16 which removes a board 14 from the feed mechanism 12, feeds it into the print zone of a screen print assembly 18 and then carries it back out to the feed mechanism 12, which is indexed to start the cycle over again. The feed mechanism 12 has a slotted platen 22 slidably connected to a table 24 to facilitate movement of the platen 22 as needed to advance printed circuit boards 14 that have been loaded on their edges into slots 26. The slotted platen 22 is chain driven by a dc motor (not shown) mounted under the table 24. After a predetermined number of the boards have been processed, the boards as a group are transported to a curing oven 20. The apparatus is computer driven to control this sequential operation.

Figure 2:
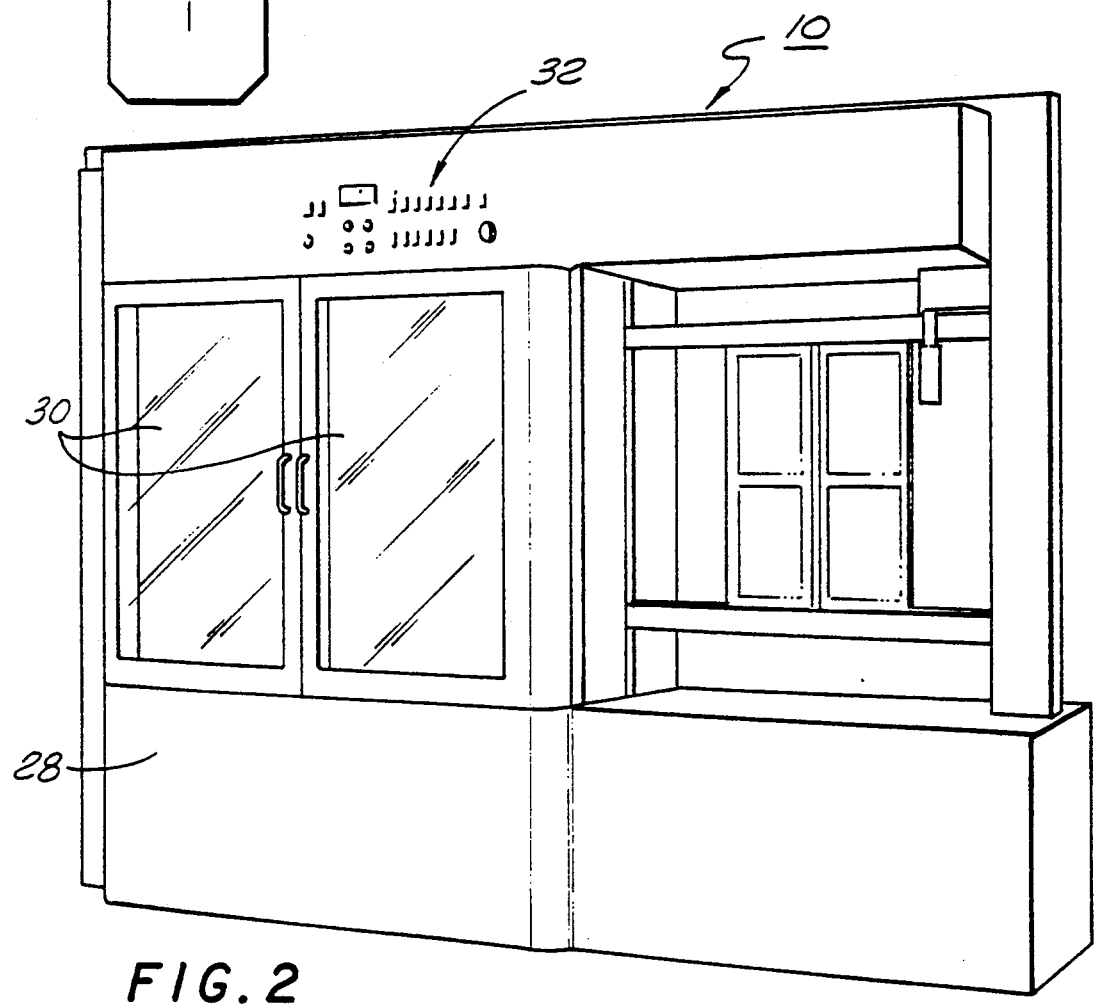
FIG. 2 is a pictorial view of the invention and associated enclosure, less feed and output racks.

A pictorial view of one embodiment of the screening apparatus 10, less the feed mechanism 12, is shown in FIG. 2. Here, the screen print assembly is in a protective enclosure 28 which serves to facilitate atmospheric control over print conditions and minimize contamination of the photoimagable soldermask materials. The enclosure 28 is vented, the vents being regulated by a servo motor to maintain a slight positive pressure, e.g. about 1 inch water. An operator may monitor the print stroke via viewing windows 30 provided on the front, as well as on the rear side, of the enclosure 28. A control panel 32 at the top of the enclosure enables computer control of the apparatus.

Figure 3:
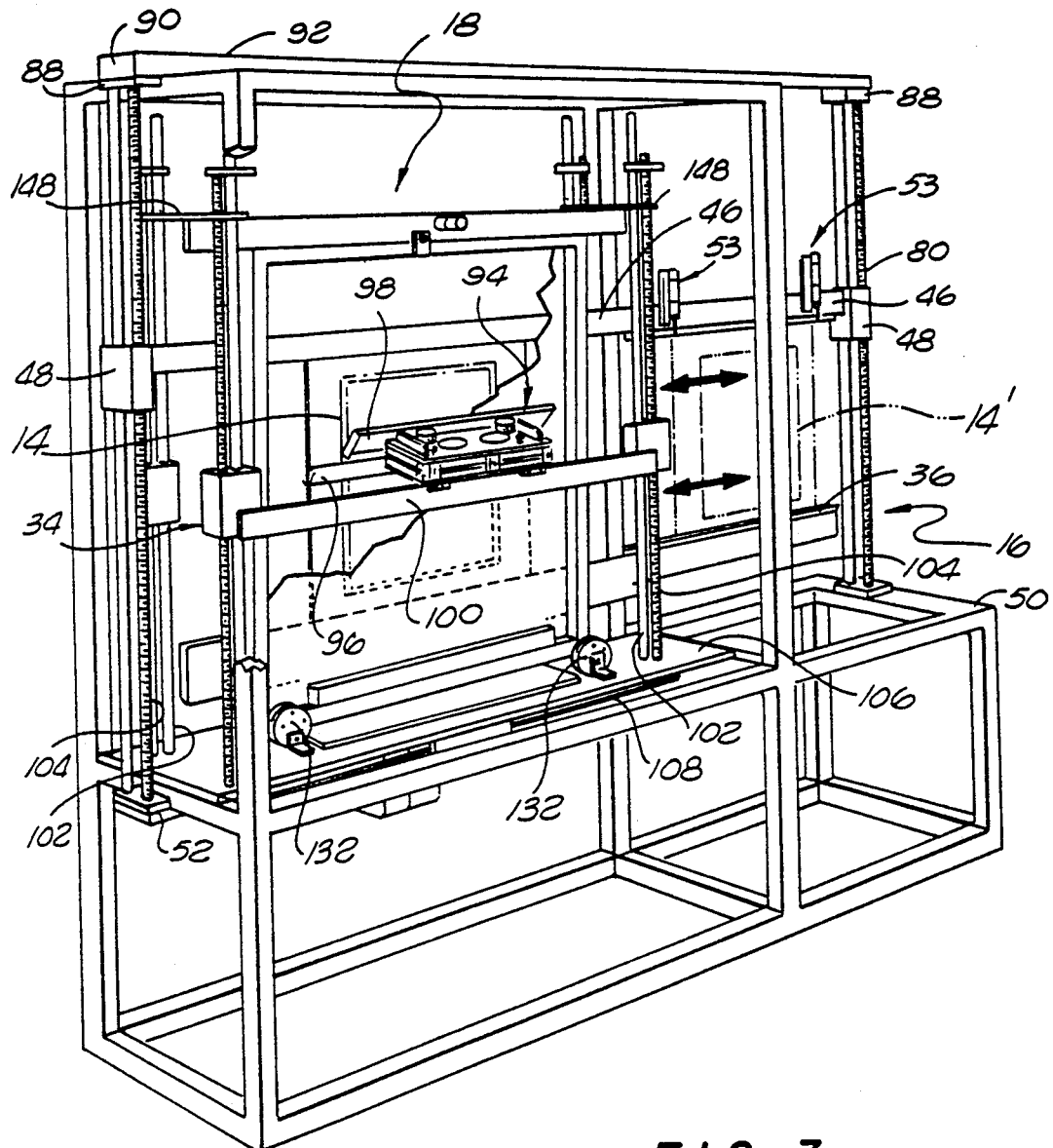
FIG. 3 is a perspective view of the invention less feed and output racks and omitting some details.

FIG. 3 shows a circuit board 14 in place in the print assembly 18 section of the apparatus and also shows the print board in shadow at 14' at its location just prior to insertion into the screen print assembly 18. When the circuit board 14 is fully located within the screen print assembly 18, it is simultaneously printed on each side by a squeegee vertical drive system 34, and unloaded without being touched by human hands.

Figure 4:
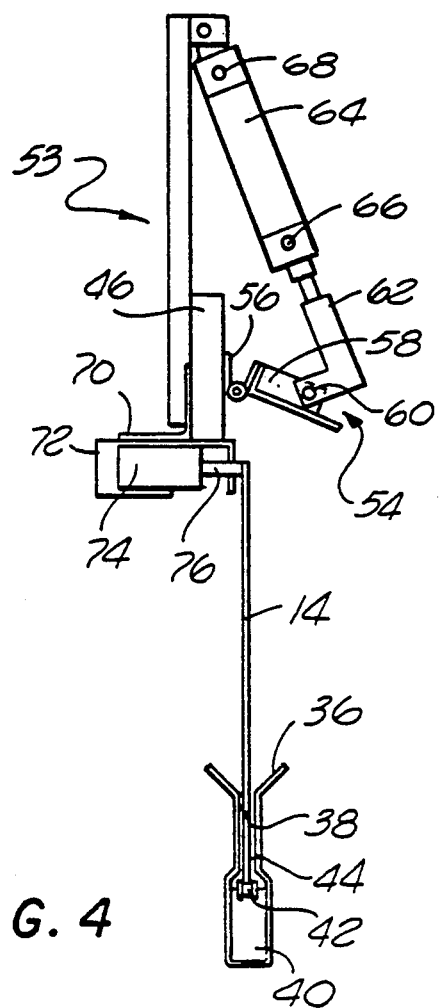
FIG. 4 is an elevational view of a guiding mechanism, in open position, for securing the top edge of the board and actuating a switch to activate the shuttling mechanism.
Figure 5:
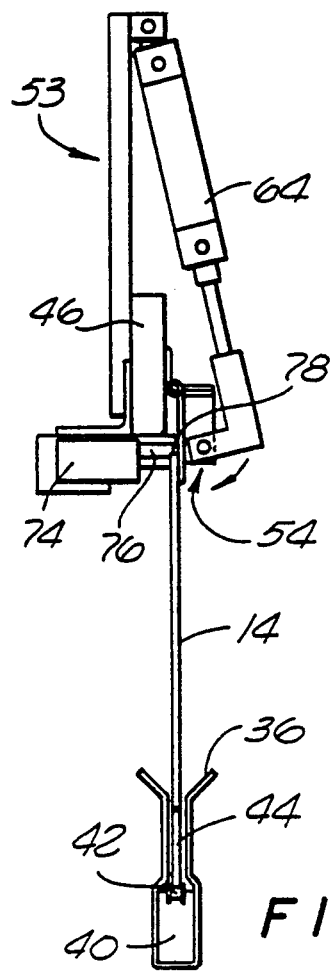
FIG. 5 is the same view as FIG. 4 but with the guiding mechanism shown in closed position.
Figure 8A:
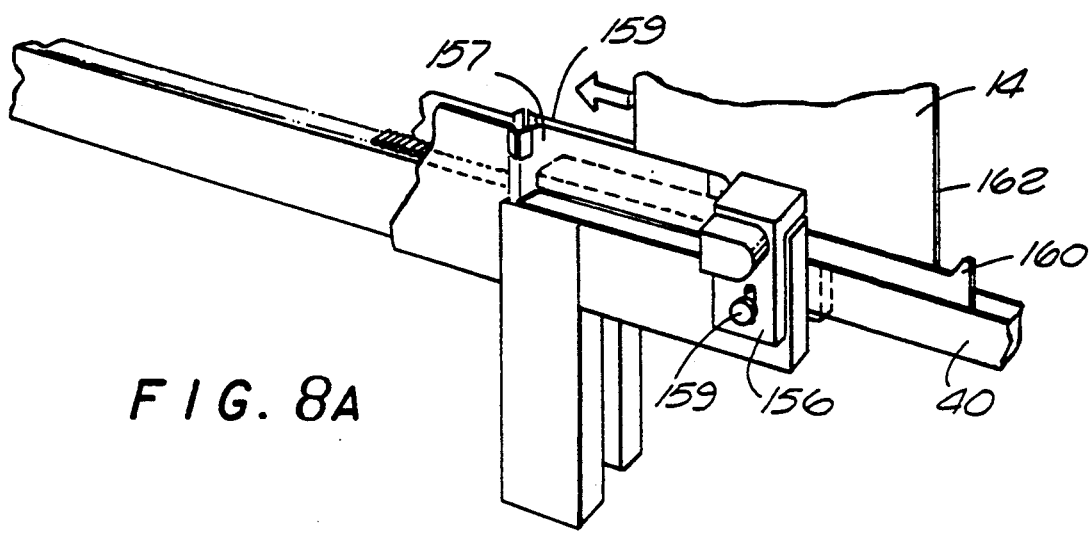
FIGS. 8A and 8B are perspective views of a portion of the shuttling mechanism showing restrainers used to assure correct alignment of the board.
Figure 8B:
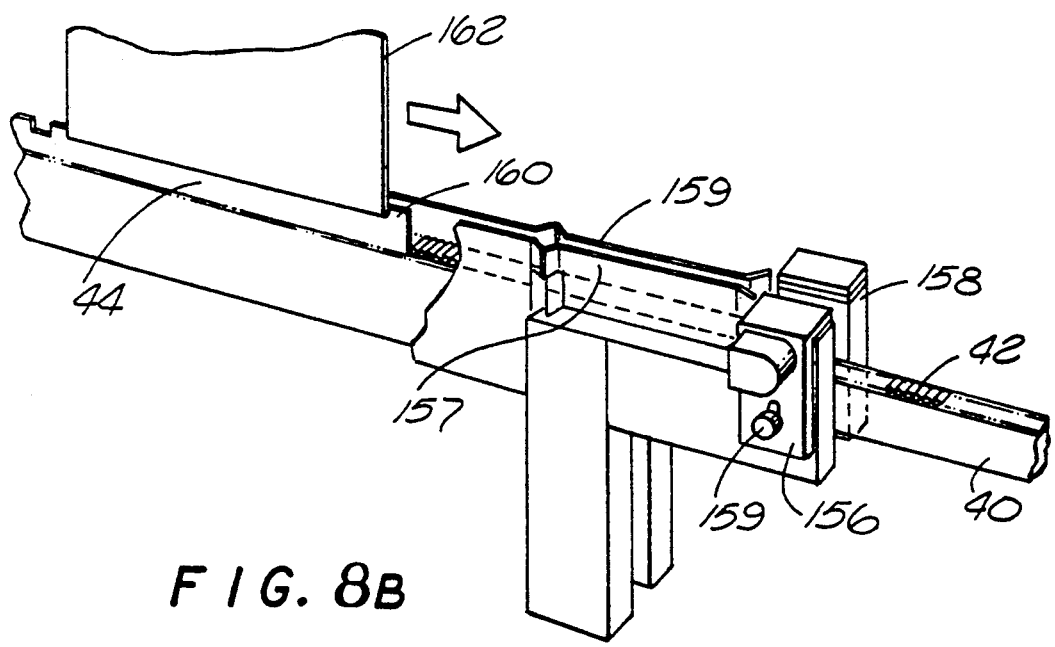

Referring additionally to FIGS. 4 and 5, as the board transport mechanism indexes a fresh circuit board into position, it is lifted by an operator and aligned so that its bottom edge 38 extends into the channel 36. Alternatively, an automatic mechanism (not shown) may be used. The channel 36 extends upwardly from a transport bar 40 which is also shown in FIGS. 8A and 8B. The transport bar 40 carries an endless chain 42, driven by a reversible motor (not shown), to which a shuttle bar 44 is attached. A more detailed description of the shuttle bar 44 will be provided below with reference to FIGS. 8A, 8B and 9.

As shown also in FIG. 3, a mounting plate 46 is spaced upwardly from the channel 36, and extends across the entire apparatus, secured at each end by housing blocks 48 that are slidably connected to the assembly frame base 50 at the input end and to an extension 52 thereof at the opposite end. Two clamp assemblies 53 are spaced apart on the mounting plate 46 on the entry side of the screen print assembly 18. A hinge clamp 54 has its upper leaf 56 bolted to the mounting plate 46 and has an upright portion 58 secured at a pivot point 60 to an L-shaped arm 62 connected to and driven by a pneumatic cylinder 64 which is opened and closed by means of air lines (not shown) attached at an inlet 66 and outlet 68. An angle bracket 70 is affixed to the bottom rear side of the mounting plate 46 and includes a dependent extension 72 to which is affixed a push button switch 74 in which the button 76 is spring loaded to a normally open position. Referring to FIG. 5, when the circuit board 14 is placed in the channel 36, it pushes against the switch button 76 to close the switch 74 thereby actuating (through means not shown) the pneumatic cylinder 64 to a closed position, causing the bottom portion of the hinge clamp 54 to impinge against the circuit board 14 adjacent its upper edge 78.

Simultaneously with actuation of the pneumatic cylinder 64, the switch 74 also actuates the transport mechanism, causing the chain 42 to move, carrying the shuttle bar 44 and, along with it, the circuit board 14.

Figure 6:
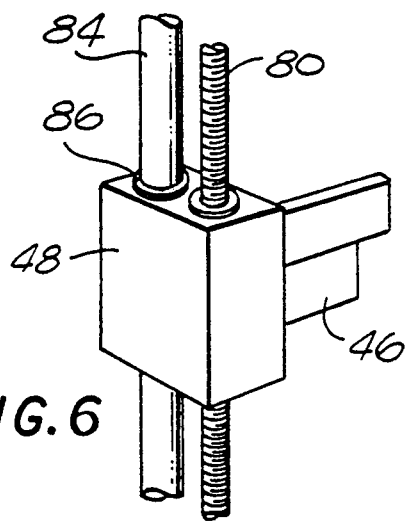
FIG. 6 is a perspective view of the mounting plate and block.
Figure 7:
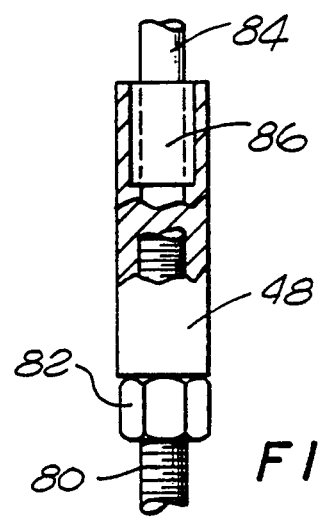
FIG. 7 is a cut-away perspective view of the mounting block.

Referring again to FIG. 3, along with FIGS. 6 and 7, the housing blocks 48 carrying the mounting plate 46 are each supported on a screw 80 and nut 82 at each end of the unit, guided by rods 84 and linear bearings 86. The bolts 80 and rods 84 are mounted at their lower ends adjacent opposite sides of the longitudinal center line of the assembly frame base 50, stabilized at the top ends thereof by top support bearings 88 which are connected to a longitudinal extension 90 from the assembly frame top 92.

Figure 12:
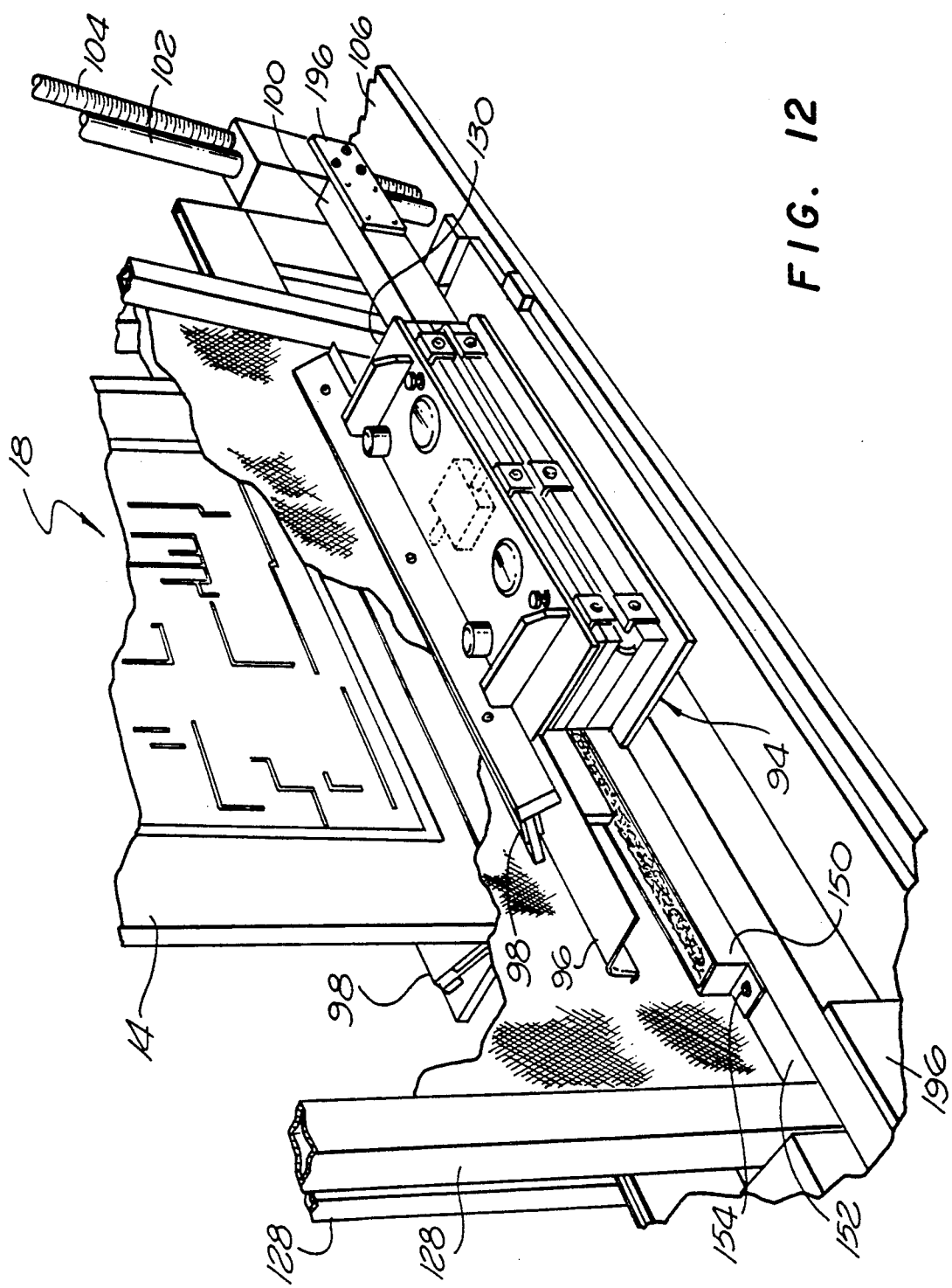
FIG. 12 is a partial perspective view of the invention showing a portion of the screen print assembly.

FIGS. 3 and 12 provide an overall view of the screen print assembly 18. A squeegee vertical drive system 94 is formed by conjunctively mounting opposing flood blades 96 and opposing print squeegees 98 onto cross members 100. The cross members 100 are slidably attached as hereinafter described, to guide bars 102, and they are screw driven in a vertical plane by screw systems 104 which are mounted on each of the four corners of a system base plate 106, details of which are shown in FIG. 15. Referring additionally to FIG. 13, the screw systems 104 are driven by a single chain 108 and a single dc motor 110 mounted on the bottom side of the base plate 106. The screw systems 104 are connected to sprockets 112 interlinked by the chain 108 to a sprocket 114 driven by the motor 110 and are also linked to an idler sprocket 116 that is loaded by a spring 118 and held in place by a bar 120 pivotally mounted at 122 on a bearing 124. The idler sprocket is unloaded by means of a pneumatic cylinder 126 when it is desired to remove the chain 108, e.g., for servicing. Further details of the squeegee vertical drive assembly can be seen in FIGS. 14, 16, 20, and 21.

Figure 16:
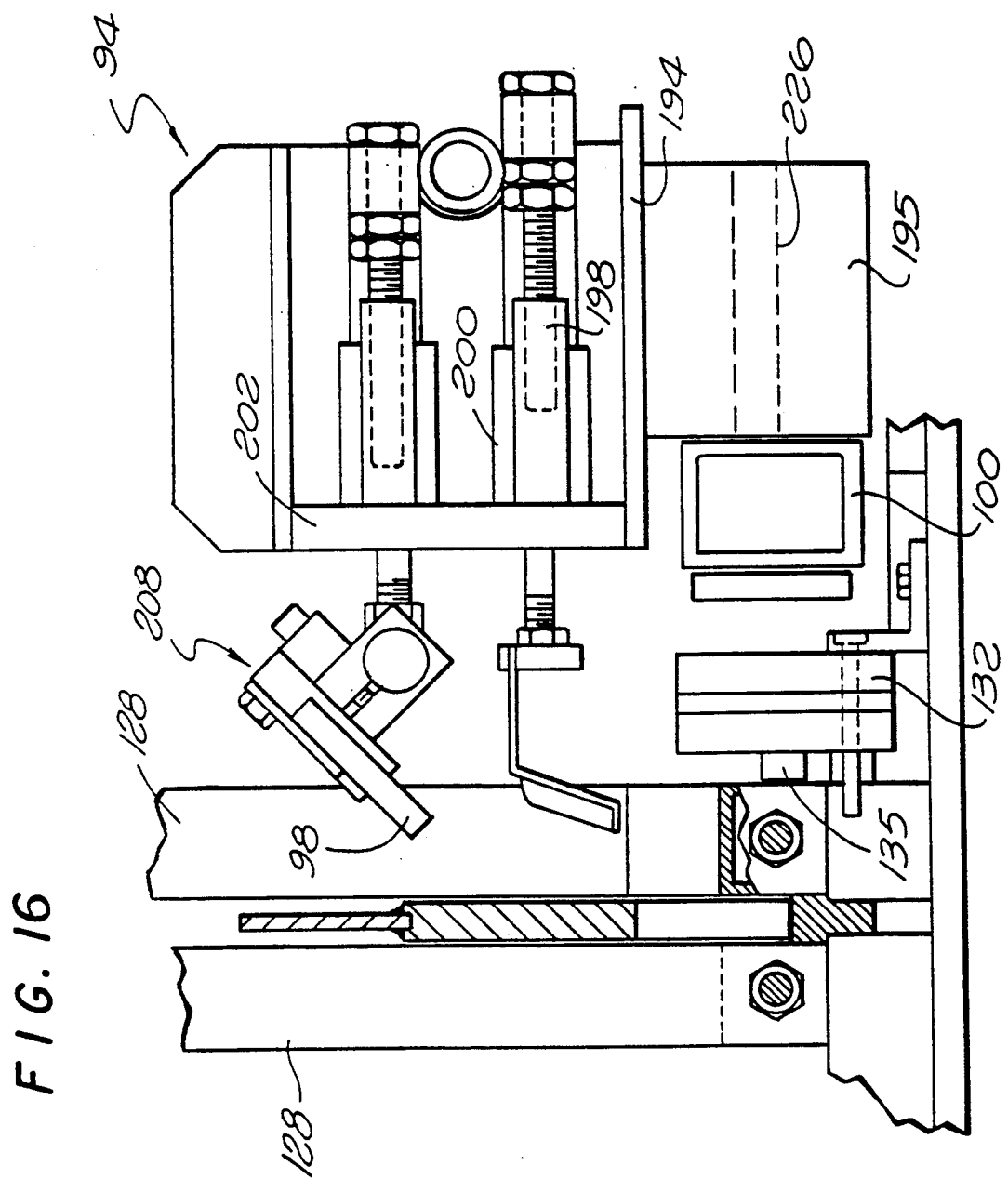
FIG. 16 is a partial cross-sectional view of the invention showing one side of the squeegee system.

Referring to FIGS. 12 and 14, disposed between the opposing flood blades and opposing squeegees (see FIG. 12) are two vertical chases 128 that are pivotally mounted about their bases 130 with a series of air driven cylinder clamps 132 (FIG. 14) affixed to the system base plate 106 via brackets 134 therefor. Referring to FIG. 16, a piston 135 is pneumatically extendable from the cylinder clamp 132 to impinge against the surface of the associated chase. The cylinder clamps 132 thus facilitate rapid removal and replacement of the chases.

Referring again to FIG. 14, as well as to FIG. 17, as is known in the art, a pliable print screen 136 is disposed within each chase 128. In order to provide stability for the pivotally mounted chases, and to reduce off contact during the print stroke by pivotally driving the chase. Each chase 128 is provided with a slotted flange 138 near the center of the chase top 140, as shown more particularly in FIG. 17, which is adapted to be connected to, and form a leverage point for, the headed neck 141 of a piston member 142 driven by a chase-pivot pneumatic drive 143 that is mounted near the center of the print assembly top support member 144. The chases 128 are rotatably attached to the shafts of the opposing cylinders by removable clamps 146. The clamps 146 and the cylinder clamps 132 constitute the sole securement means for the chases, allowing the chases to be easily removed. Referring additionally to FIGS. 18 and 19, the chase-pivot pneumatic drives are on opposite sides of the chases 128, interacting therewith through openings in the print assembly top support member 144. The top support member 144 extends along the longitudinal center line of the screen print assembly 18 and is tied to adjustable cross-ties 148 (FIG. 3) at each end thereof.

Figure 20:
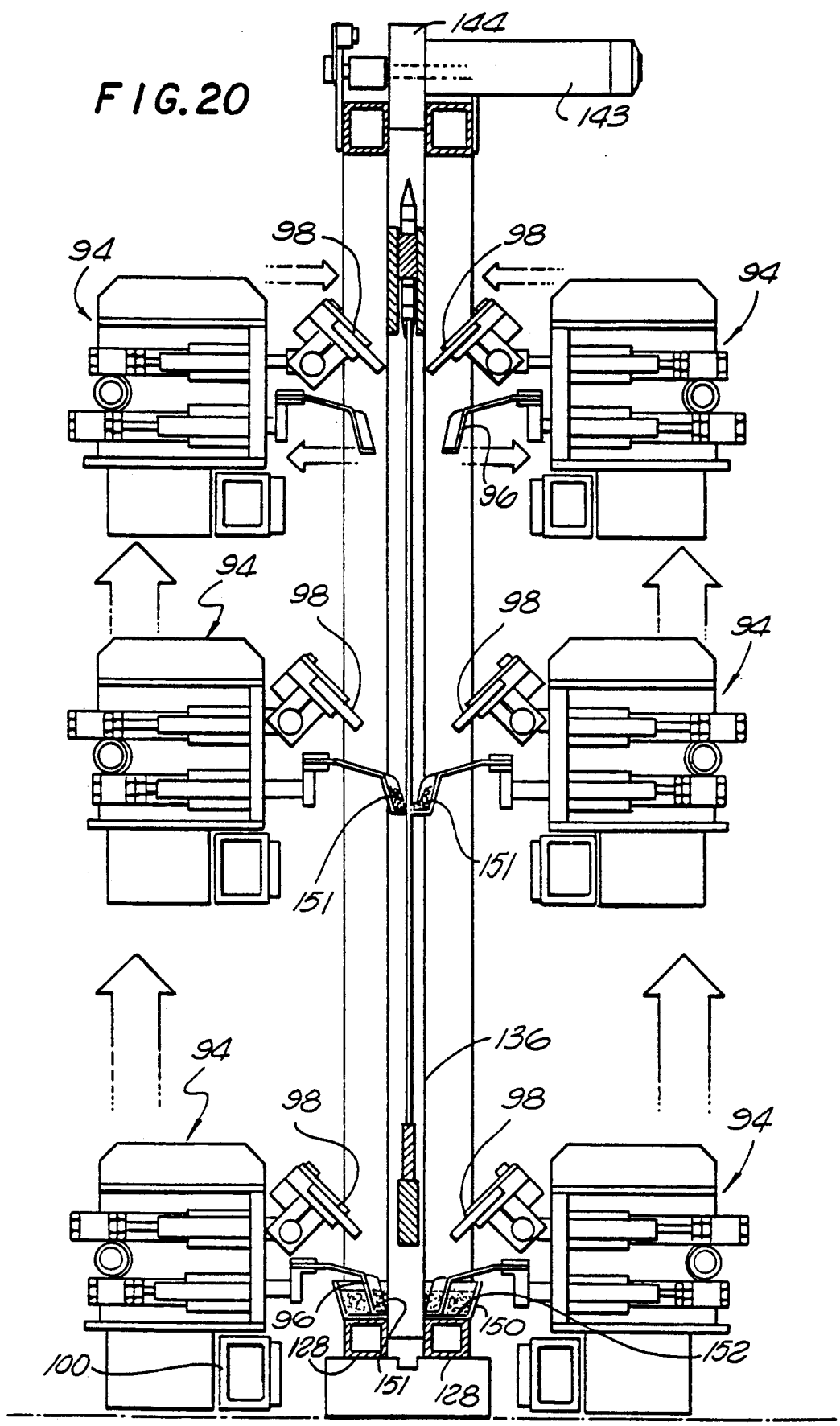
FIG. 20 is a schematic cross-section of the invention showing the flood stroke.

Of critical importance to the printing sequence is the transfer of photoimagable soldermask material, commonly referred to as "ink", to the screen. Referring to FIGS. 12 and 20, an ink reservoir 150, containing ink 151, is provided along the top surface 152 of each chase 128 so as to be positioned proximate to the screen 136. The ink reservoir 150, containing ink 151, is removably connected to the chase base with suitable attachment means, such as allen screws 154. This facilitates cleaning and enables the ink to be more easily saved after the chase is removed.

The precision operating characteristics of this invention will be better appreciated upon reference to FIGS. 8 through 11. FIG. 8A shows a circuit board 14 carried by the shuttle bar 44 with the board restrained between a pair of opposed retaining clamps 156, 158 (FIG. 8B) and disposed partially between channel guides 157, 159. The shuttle bar 44 is equipped with a trailing feed dog 160, the purpose of which is to engage a rear edge 162 of the circuit board. The circuit boards in one lot can vary by as much as ¼ inch requiring that the shuttle bar be longer than the narrowest board by at least ¼ inch, but the position of the board on the shuttle must be known in order to place it at the correct place on the screen. To do this, the restraining clamps 156, 158 frictionally restrain the board 14 as it passes by, carried by the shuttle bar 44. The clamps 156, 158 are pneumatically held normally open by constant air pressure against the counterurging of springs 159. The shuttle bar 44 slides beneath the board 14 until the trailing feed dog 160 contacts the rear surface 162 of the board 14. Thereafter, the pneumatic pressure is cut off to release the clamps 156, 158 so that the shuttle bar 144 can carry the circuit board accurately aligned into the print screen assembly as shown in FIG. 8B. Referring to FIG. 9, a mechanism, covered by a shield 165, is shown for varying the horizontal position of the circuit board 14 between flood and print sequences. A switch housing 164 is provided, which is shown in more detail in FIGS. 10 and 11, and includes a stop switch rod 166 that terminates with a cylindrical head 168. The shuttle bar includes a forward end dog 170 that impinges the stop switch rod head 168 to trip the switch in the housing 164, terminating forward travel of the board 14. Subsequent to a flood/print sequence, movement of the chain 42 is reversed to carry the board 14 out of the print assembly. A return dog 172 on the shuttle bar assures movement of the circuit board 154 against slippage.

Figure 10:
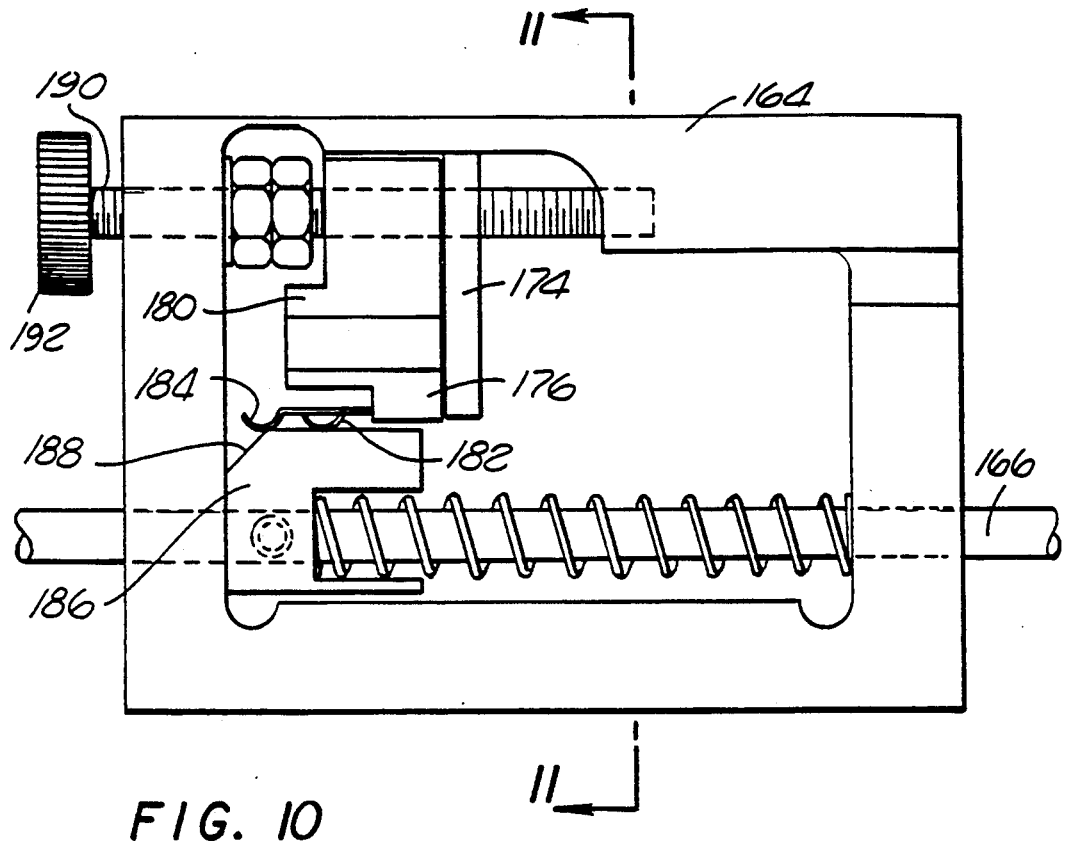
FIG. 10 is a plan view of a mechanism for adjustably alternating the location of the horizontal travel stop.
Figure 11:
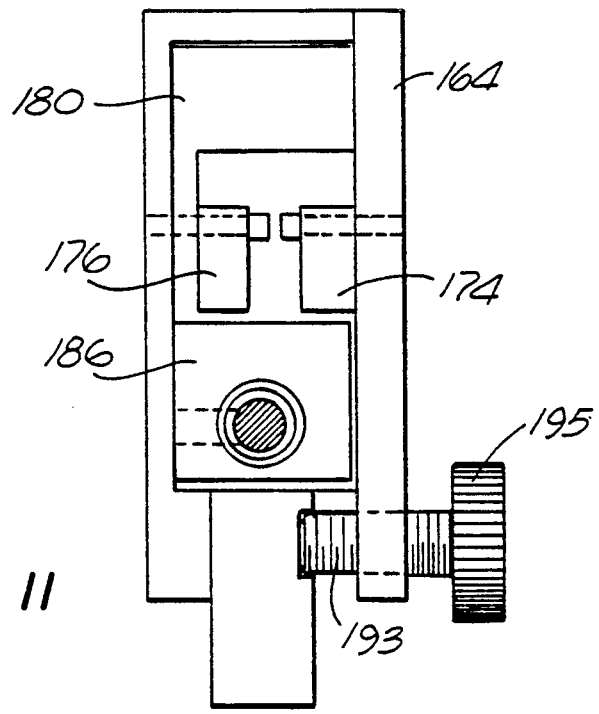
FIG. 11 is a view of the device of FIG. 10 taken on the line 11—11.

Referring to FIGS. 10 and 11, the switch housing 164 contains two switches, a fixed stationary switch 174 and a movable switch 176. The stationary switch is fixed to a wall 178 of the housing 164 while the movable switch is fixed to a switch slide 180. Each switch is fitted with a spring catch 182, 184, respectively, each of which is shaped to ride along a stop slide 186 that is connected to the stop switch rod 166 and which is formed with a bevel 188 along its rear top edge that permits the spring catch 182 or 184 to be pushed up to close the switch. The switch slide 180 is movable by connection to a bolt 190 threaded through the switch housing 164 and controlled by a knob 192 to change the position of the movable switch 176. The switch housing 164 is mounted to the frame of the apparatus by a securing bolt 193 having a head 195.

In operation, as the shuttle bar 44 moves rearwardly, its end dog 170 impinges the stop switch cylinder head 168, pushing the stop switch rod 166, and therefor the stop slide 186, rearwardly. The electronic circuitry is such that the motor driving the chain 42 that carries the shuttle bar 44 is alternately switched off first by one switch and then by the other. For example, with a particular board 14 the chain is stopped by the stationary switch and with the next board 14 by the movable switch. Since one can change the travel stop location of the shuttle bar 44 by means of the knob 192 and bolt 190, any degree of jog (within the limits of the switch mechanism) can be set, for example ¼ inch.

Figure 22:
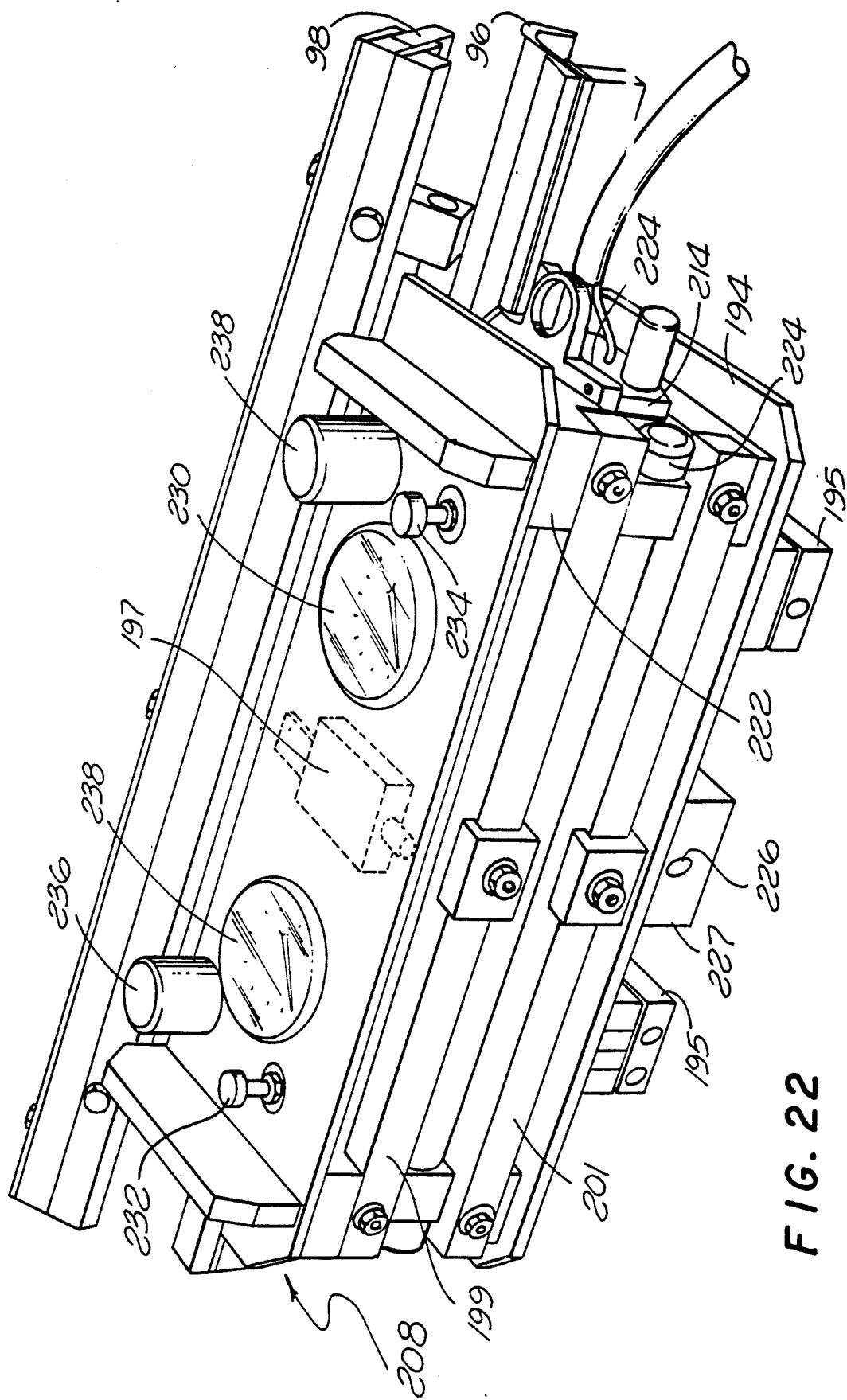
FIG. 22 is a perspective view of the flood bar/print squeegee assembly head.

To further describe the design and operating characteristics of the squeegee vertical drive system element of this invention, attention is again directed to FIG. 12 together with FIG. 22. A flood blade 96 and print squeegee 98 are each mounted on a platform 194. The platform 194 is joined by legs 195 to a horizontal cross member 100 that has attachment flanges 196 on each end thereof. Referring also to FIG. 16, the flood blade 96 is joined to a hardened steel Thompson rod 198 carried by a lower linear bearing 200 which extends through an aperture in the vertical wall 202 connected to the platform 194.

A print squeegee 98 is disposed over the flood blade 96 on the same vertical wall 202. The print squeegee 98 is joined to a hardened steel Thompson rod 204 carried by an upper linear bearing 206 extended through an aperture in the vertical wall 202. Pivotal attachment is accomplished by a squeegee pivot assembly 208 formed of a bar 210 and a clamp 212 which can be adjusted to accomplish a desired vertical angle for the squeegee.

Stops 214 (FIG. 22) are provided to separately limit the horizontal movement of the flood blade and squeegee. Preferably, stops are used on one chase while the squeegee on the other chase operates without stops (or with stops at extreme positions). This enables the opposing squeegees to achieve and maintain parallel alignment. As shown in FIG. 15, the entire unit is slidably attached to a linear bearing assembly via bearing blocks 218, driven in a vertical plane by the chain 108 and ball screw and nut system 104.

Referring to FIG. 20, at the start of a flood/print sequence, the squeegee vertical drive system 94 is at the bottom of the screen print assembly 18. The flood blades 96 are immersed in the ink 151 in the ink reservoir 150, and are extended to the most proximate position with respect to the screen 136. As the sequence begins, the vertical drive system rises from the ink reservoir thereby spreading the ink 151 onto the surface of the screen 136. The print squeegees 98 remain in their initial positions away from the print screen. After the vertical drive system reaches the top of the area to be printed, the flood blades 96 are retracted and the print squeegees 98 are extended so as to force the screens 136 to contact the circuit board 14.

Figure 21:
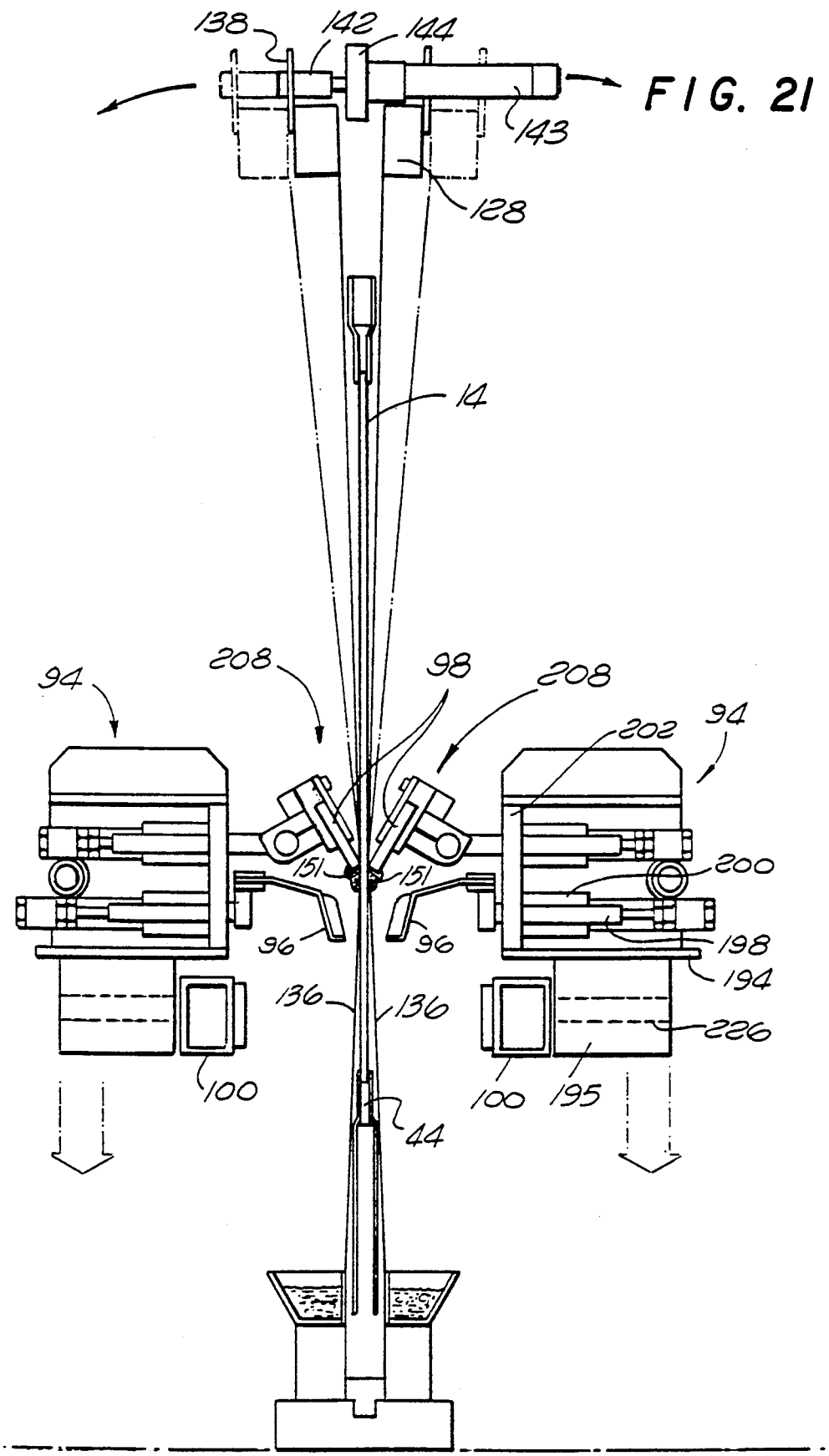
FIG. 21 is a schematic cross-section of the invention showing the print stroke.

Referring to FIG. 21, at the start of the downward print stroke, the squeegee pivot assemblies 208 and print squeegees 98 are pushed toward their respective screens 136, impinging the rear surface of each screen onto the respective surface of the circuit board 14. As the drive system 94 descends, the squeegees 98 progressively sweep ink 151 through the screens onto the surface of the board 14. Finally, at the bottom of the screens, the squeegees 98 and squeegee pivot assemblies 208 are retracted. At the same time, the chase pivot drive 143 is activated and operates as described with respect to FIGS. 17 through 19 to separate the chases.

Activation of the chase pivot drive 143 causes the chases 128 to pivot about their respective bases and causes the screens the separate from the board. The chases are pivotally driven by the drive 143 formed from opposing cylinders that have been mounted on each side of the top support member 144 over apertures provided to permit the cylinder piston 142 to extend through and contact the flanges 138 provided along the respective chase tops 144 as described with respect to FIG. 19. As the chases 128 are separated, the inked screens are pulled away from the inked board 14.

After this first print stroke, just before the flood blade reaches the ink reservoir 150, a second print stroke is initiated in the same flood/print sequence. The assemblies 208 are raised by the vertical drive system without a flood stroke and a second print stroke is executed.

Referring now to FIG. 22, the squeegee pivot assembly 208 is shown in greater detail. The squeegee 98 and flood blade 96 are each connected by the Thompson rods and their linear bearings (hidden in FIG. 22) to a carriage 222 which rotates around a pivot rod 224 and which is carried by the platform 194. The squeegee and flood blades are also each connected to a central solenoid (shown in shadow at 197) that operates on respective cross bars 199 and 201 to move the squeegee and flood blades in and out.

As shown in shadow in FIG. 21, a bearing 226 contained in a bearing block 227 (see also FIGS. 23-25) enables the platform 194 to tilt or skew. The flood blade and squeegee assembly includes gauges 228 and 230 which measure the pressure applied to the squeegee and flood glade, respectively, by pneumatic cylinders (not shown). Regulators 232 and 234 are provided to enable adjustment of the pressures applied respectively to the print squeegee and flood blade. Bolt retainers 236 and 238 secure the assembly together.

Figure 23:
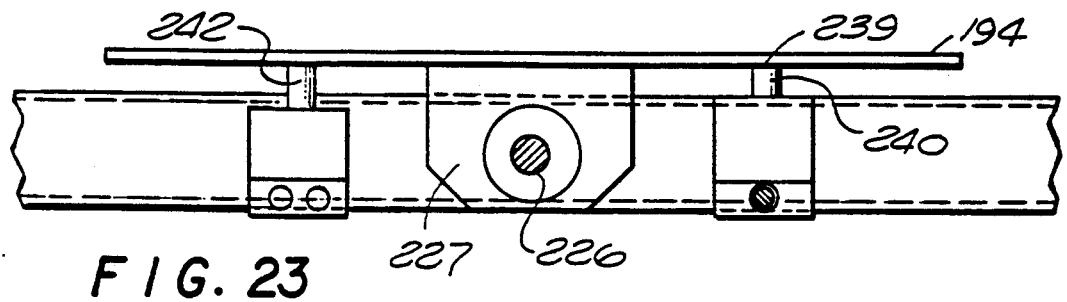
FIG. 23 is a schematic view of the print squeegee platform and support in a horizontal position.
Figure 24:
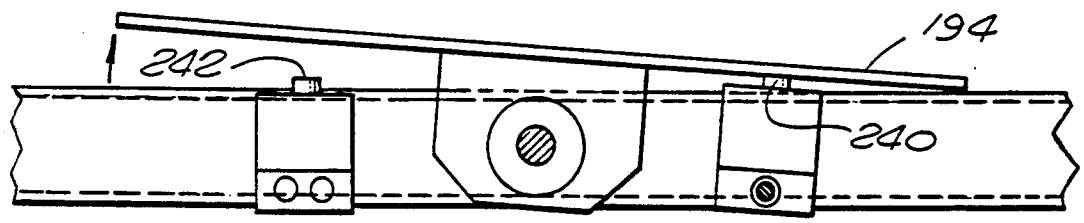
FIG. 24 is the same view as FIG. 23 but showing the platform tilted to one side.
Figure 25:
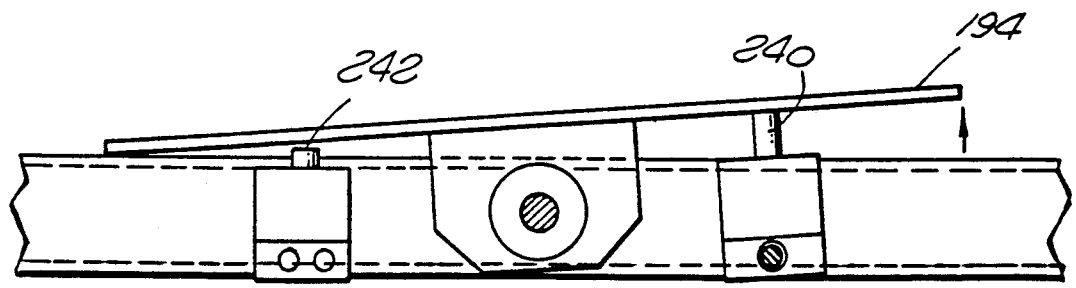
FIG. 25 is the same view as FIG. 24 but showing the platform tilted to the opposite side.

FIGS. 23 through 25 show the mechanism for skewing or tilting the print squeegee first to one side and then to the other side. The platform 194 is pivotally attached at 239 to a pneumatically driven piston rod 240 which is overriden by another pneumatically driven piston rod 242. When tilting the platform in one direction, both piston rods 240 and 242 are withdrawn, as in FIG. 24. To tilt in the opposite direction, the attached piston rod 240 only is extended, as in FIG. 25. To dispose the platform horizontally, both piston rods 240 and 242 are extended, as shown in FIG. 23. In this way, one can tilt the print squeegee assembly first in one direction during the first print stroke in the flood/print sequence, then in the other direction in the second print stroke in that sequence. In practice, to enable better coverage, each print stroke starts off horizontally then rotates as the squeegees are driven down. The rate of rotation is adjustable.

I claim:

1. In a vertical screening apparatus for simultaneously screening each side of a board with inking material in which two vertically oriented chases are mounted in opposing spaced relationship with respect to each other, opposing flood blades and print squeegees are vertically reciprocated through flood and print sequences on opposite sides of the chases, and a board transport mechanism is synchronously integrated therewith for sequentially moving said board upright into and out of a print zone between said chases respectively before and after said vertical reciprocation, said board transport means comprising means for reciprocally shuttling said upright board into and out of said print zone respectively before and after said vertical reciprocation and including means for restraining the top edge of said board while it is moved into said print zone, and a switch positioned to be actuated by said top edge restraining means, said switch activating said shuttling means.

2. In a vertical screening apparatus for simultaneously screening each side of a board with inking material in which two vertically oriented chases are mounted in opposing spaced relationship with respect to each other, opposing flood blades and print squeegees are vertically reciprocated through flood and print sequences on opposite sides of the chases, and a board transport mechanism is synchronously integrated therewith for sequentially moving said board upright into and out of a print zone between said chases respectively before and after said vertical reciprocation, to said board transport means comprising means for reciprocally shuttling said upright board into and out of said print zone respectively before and after said vertical reciprocation said shuttling means comprising means defining a horizontal channel in said print zone along the bottom of said chases and means for receiving the bottom edge of said board and carrying said board through said channel, and means for automatically locating the horizontal position of a vertical edge of said board, comprising at least one feed dog connected to said carrying means for impingement against a trailing edge of said board, and means for restraining said board against horizontal movement by said carrier means but allowing horizontal movement by said carrier means upon impingement of said feed dog against the trailing edge of said board.

3. The apparatus according to claim 2 in which said restraining means comprises means for frictionally engaging said board, the level of frictional engagement being sufficient to resist movement of said board by said carrier means but insufficient to resist movement of said board by said feed dog.

4. In a vertical screening apparatus for simultaneously screening each side of a board with inking material in which two vertically oriented chases are mounted in opposing spaced relationship with respect to each other, opposing flood blades and print squeegees are vertically reciprocated through flood and print sequences on opposite sides of the chases, and a board transport mechanism is synchronously integrated therewith for sequentially moving said board upright into and out of a print zone between said chases respectively before and after said vertical reciprocation, said board transport means comprising means for horizontally reciprocally shuttling said upright board into and out of said print zone respectively before and after said vertical reciprocation, and horizontal shift means including means for changing the extent of horizontal movement of said board whereby to change the horizontal placement of said board in said print zone from one flood and print sequence to another.

5. The apparatus according to claim 4 in which said horizontal shift means comprises means defining a horizontal travel stop for said board and means for alternating said travel stop between two horizontal locations from one flood and print sequence to another.

6. The apparatus according to claim 5 including means for changing the distance between said two horizontal locations.

7. In a vertical screening apparatus for simultaneously screening each side of a board with inking material in which two vertically oriented chases are mounted in opposing spaced relationship with respect to each other, opposing flood blades and print squeegees are vertically reciprocated through flood and print sequences on opposite sides of the chases, and a board transport mechanism is synchronously integrated therewith for sequentially moving said board upright into and out of a print zone between said chases respectively before and after said vertical reciprocation, said board transport means comprising means for reciprocally shuttling said upright board into and out of said print zone respectively before and after said vertical reciprocation, and including means for tilting each of said print squeegees whereby to execute at least a part of said print stroke with the edge of each print squeegee disposed at an angle from horizontal, means for automatically alternating the angular disposition of said print squeegee between acute and obtuse angles with respect to said board from one print stroke to another.

8. The apparatus according to claim 7 in which said tilting means rotates each print squeegee about a substantially horizontally central axis.

9. The apparatus according to claim 7 in which said tilting means rotates said print squeegees in parallel alignment at the same angle from horizontal about a substantially horizontally central axis, alternating the angle of disposition of said squeegees between acute and obtuse from one print stroke to another.

* * * * *